(12) United States Patent
Soeno et al.

(10) Patent No.: US 9,966,460 B2
(45) Date of Patent: May 8, 2018

(54) SWITCHING DEVICE

(71) Applicant: TOYOTA JIDOSHA KABUSHIKI KAISHA, Toyota-shi, Aichi-ken (JP)

(72) Inventors: Akitaka Soeno, Toyota (JP); Takashi Kuno, Kariya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days. days.

(21) Appl. No.: 15/425,411

(22) Filed: Feb. 6, 2017

(65) Prior Publication Data

US 2017/0263738 A1    Sep. 14, 2017

(30) Foreign Application Priority Data

Mar. 9, 2016 (JP) ................. 2016-046118

(51) Int. Cl.
| *H01L 29/739* | (2006.01) |
|---|---|
| *H01L 23/528* | (2006.01) |
| *H01L 29/06* | (2006.01) |
| *H01L 29/10* | (2006.01) |
| *H01L 29/423* | (2006.01) |

(52) U.S. Cl.
CPC ...... *H01L 29/7397* (2013.01); *H01L 23/5283* (2013.01); *H01L 29/0619* (2013.01); *H01L 29/0696* (2013.01); *H01L 29/1095* (2013.01); *H01L 29/4236* (2013.01)

(58) Field of Classification Search
CPC ............. H01L 23/5283; H01L 29/0619; H01L 29/0696; H01L 29/1095; H01L 29/4236; H01L 29/7397
See application file for complete search history.

(56) References Cited

U.S. PATENT DOCUMENTS

| 2005/0077617 | A1 | 4/2005 | Hirano et al. | |
|---|---|---|---|---|
| 2013/0277735 | A1* | 10/2013 | Kinzer | H01L 29/41766 257/330 |
| 2016/0351562 | A1* | 12/2016 | Senoo | H01L 27/0664 |
| 2017/0025410 | A1* | 1/2017 | Cheng | H01L 27/0727 |
| 2017/0025521 | A1* | 1/2017 | Nakagawa | H01L 29/7397 |

(Continued)

FOREIGN PATENT DOCUMENTS

| JP | 2005-116963 A | 4/2005 |
|---|---|---|
| JP | 2014-038963 A | 2/2014 |

(Continued)

*Primary Examiner* — Abul Kalam
(74) *Attorney, Agent, or Firm* — Oliff PLC

(57) ABSTRACT

A switching device includes a semiconductor substrate having a first element range and an ineffective range. First trenches extend in a first direction across the first element range and the ineffective range. Second trenches are provided in each inter-trench region within the first element range and are not provided within the ineffective range. A gate electrode is disposed in the trenches. No contact hole is provided in an interlayer insulating film within the ineffective range. The first metal layer covers the interlayer insulating film. The insulating protective film covers a portion of the first metal layer on its outer peripheral side within the ineffective range. The second metal region is in contact with the first metal layer within an opening of the insulating protective film, and is in contact with a side surface of the opening.

5 Claims, 10 Drawing Sheets

(56) References Cited

U.S. PATENT DOCUMENTS

| | | |
|---|---|---|
| 2017/0040316 A1* | 2/2017 | Soeno ................. H01L 21/8234 |
| 2017/0084735 A1* | 3/2017 | Takeuchi ............ H01L 21/8213 |
| 2017/0162680 A1* | 6/2017 | Soeno ................. H01L 29/7397 |
| 2017/0213907 A1* | 7/2017 | Soeno ................. H01L 29/7813 |
| 2017/0263739 A1* | 9/2017 | Soeno ................. H01L 29/7397 |
| 2017/0263754 A1* | 9/2017 | Soeno ................. H01L 29/7813 |

FOREIGN PATENT DOCUMENTS

| | | |
|---|---|---|
| JP | 2015-225872 A | 12/2015 |
| JP | 2017-028069 A | 2/2017 |

* cited by examiner

FIG. 9    [PRIOR ART]
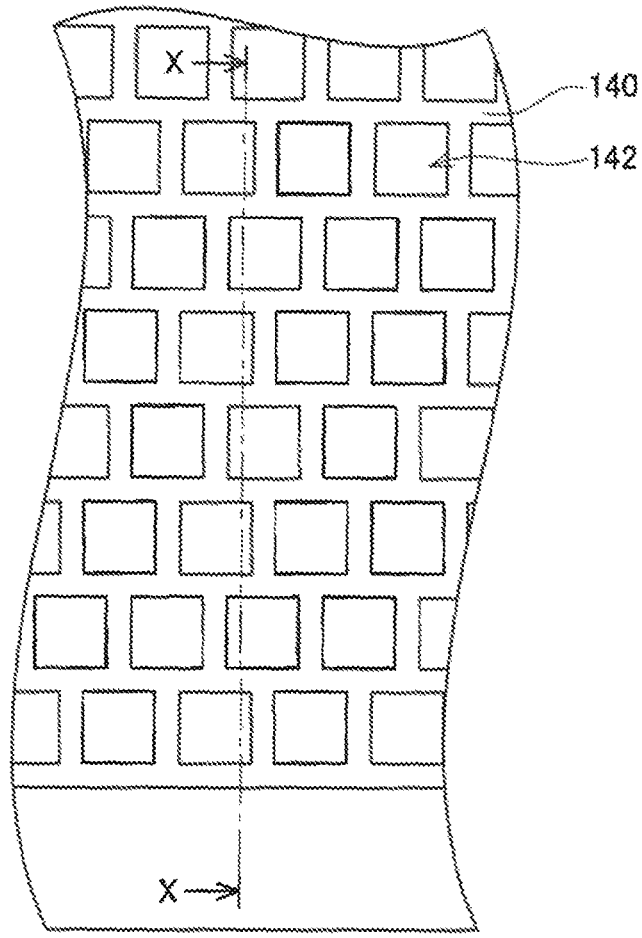

FIG. 10 [PRIOR ART]
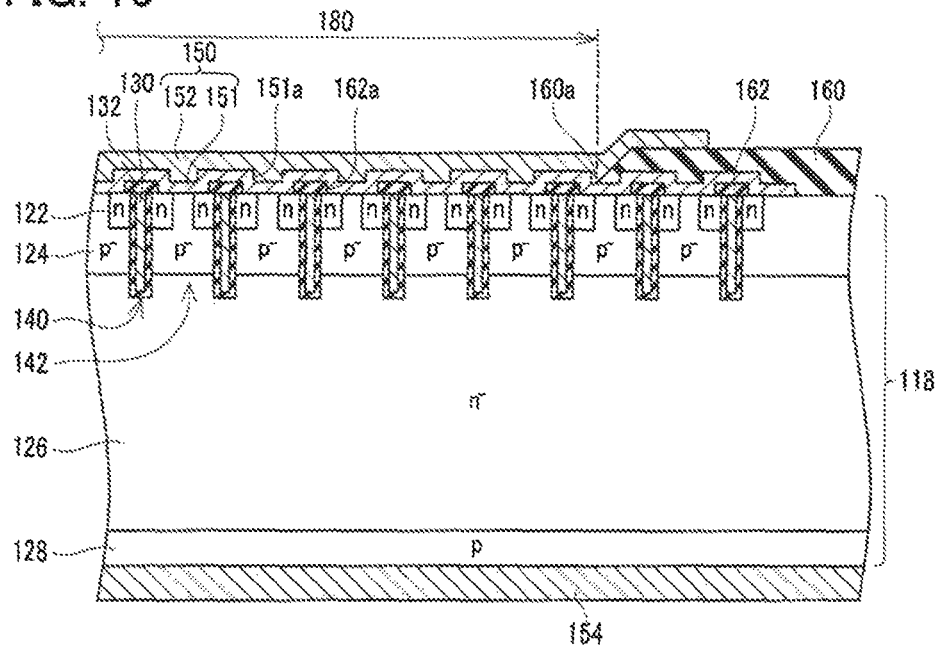
FIG. 11 [PRIOR ART]
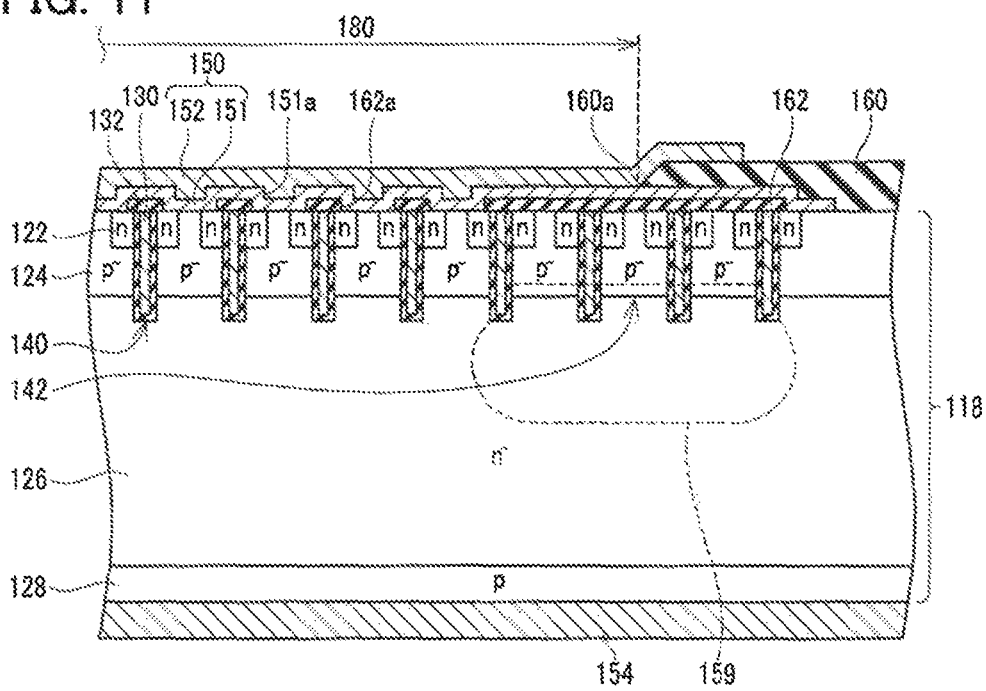

SWITCHING DEVICE

TECHNICAL FIELD

The present disclosure relates to a switching device.

BACKGROUND ART

Japanese Patent Application Publication No. 2005416963 discloses a switching device having a semiconductor substrate, an upper surface of which is connected to a heat sink block by soldering.

Further, Japanese Patent Application Publication No. 2015-225872 discloses a switching device having a trench that extends in a grid shape in an upper surface of a semiconductor substrate. The trench that extends in the grid shape includes a plurality of first trenches and a plurality of second trenches. The first trenches extend parallel to each other along a certain direction. The plurality of second trenches is provided in each inter-trench region interposed between the first trenches. Each second trench is connected to the first trenches on its both sides. Inner surfaces of the first trenches and inner surfaces of the second trenches are covered with a gate insulating film. A gate electrode is disposed across inner portions of the first trenches and inner portions of the second trenches. An interlayer insulating film covers the upper surface of the semiconductor substrate and the gate electrode. A contact hole is provided in the interlayer insulating film on an upper portion of each of rectangular regions (hereinafter referred to as a cell region) surrounded by the first trenches and the second trenches in the semiconductor substrate. An upper electrode covers the interlayer insulating film, and is in contact with the semiconductor substrate in the contact holes. Each cell region includes a first region (emitter region) of a first conductivity type (n-type), and a body region of a second conductivity type (p-type). Each of the first regions is in contact with the upper electrode and the gate insulating film. The body region is in contact with the upper electrode, and is in contact with the gate insulating film below the first regions. Further, the semiconductor substrate includes a second region (drift region) of the first conductivity type. The second region is in contact with the gate insulating film below the body region, and is separated from the first regions by the body region. In this switching device, when a potential of the gate electrode is controlled to a predetermined potential, channels are formed in the body region. The first regions and the second region are electrically connected by the channels. Accordingly, a current flows between the first regions and the second region.

SUMMARY

An upper electrode of such a switching device as disclosed in Japanese Patent Application Publication No. 2005-116963, usually includes a first metal layer and a second metal layer. The first metal layer is a metal layer being in contact with the upper surface of the semiconductor substrate. The first metal layer is constituted of a material that is less likely to contaminate the semiconductor substrate and makes contact with the semiconductor substrate at a low contact resistance. The second metal layer is a metal layer disposed on the first metal layer and makes contact with soldering. The second metal layer is constituted of a material that is easy to be connected to the soldering.

In a switching device that includes a trench extending in a grid shape as disclosed in Japanese Patent Application Publication No. 2015-225872, an upper electrode may be constituted of a first metal layer and a second metal layer to connect the upper electrode to an exterior by soldering. For example, FIG. 10 shows a cross section taken along line X-X of a switching device having a trench 140 extending in a grid shape as shown in FIG. 9. In FIG. 10, an upper electrode 150 is constituted of a first metal layer 151 and a second metal layer 152. When the first metal layer 151 is formed, recesses 151a are formed on a surface of the first metal layer 151 above contact holes 162a of an interlayer insulating film 162. Accordingly, the first metal layer 151 has a plurality of the recesses 151a on its upper surface. The second metal layer 152 is disposed on the first metal layer 151. Accordingly, the second metal layer 152 is filled in each recess 151a. Further, in a switching device as described in Japanese Patent Application Publication No, 2015-225872, as shown in FIG. 10, an upper surface in an outer peripheral portion of a semiconductor substrate 118 is usually covered with an insulating protective film 160. The insulating protective film 160 is provided to cover an outer peripheral side portion of the first metal layer 151 such that no gap is generated between the first metal layer 151 and the insulating protective film 160. The insulating protective film 160 has an opening 180. The second metal layer 152 covers the first metal layer 151 in the opening 180. Further, the second metal layer 152 is provided to make contact with an inner peripheral side end 160a (a side surface of the opening 180) of the insulating protective film 160 such that no gap is generated between the second metal layer 152 and the insulating protective film 160. Notably, in FIG. 10, a portion of the second metal layer 152 is disposed above the insulating protective film 160. However, the second metal layer 152 may not be disposed above the insulating protective film 160.

As the switching device in FIG. 10 operates, a temperature of the semiconductor substrate 118 rises. Then, temperatures of the first metal layer 151, the second metal layer 152 and the insulating protective film 160 also rise. A linear expansion coefficient of the second metal layer 152 is generally smaller than a linear expansion coefficient of the first metal layer 151. Further, a linear expansion coefficient of the insulating protective film 160 is generally equal to or larger than the linear expansion coefficient of the first metal layer 151. The first metal layer 151 thermally expands along with the second metal layer 152 in a range where the first metal layer 151 is in contact with the second metal layer 152. Since the linear expansion coefficient of the second metal layer 152 is small, thermal expansion of the first metal layer 151 is suppressed in the range. Especially since the second metal layer 152 is filled in each recess 151a in the upper surface of the first metal layer 151, the first metal layer 151 is firmly restrained by the second metal layer 152. Due to this, thermal expansion amount of the first metal layer 151 is small in the range where the first metal layer 151 is in contact with the second metal layer 152. On the other hand, the first metal layer 151 thermally expands along with the insulating protective film 160 in a range where the first metal layer 151 is in contact with the insulating protective film 160. Since the linear expansion coefficient of the insulating protective film 160 is relatively large, the thermal expansion amount of the first metal layer 151 is relatively large in this range. The first metal layer 151 directly below the inner peripheral side end 160a of the insulating protective film 160 is positioned at a boundary between a range having a small thermal expansion amount (the range where the first metal layer 151 is in contact with the second metal layer 152) and a range having a large thermal expansion amount (the range where the first metal layer 151 is in contact with the insulating protective film 160). Due to this, when the temperature of the switching device changes, stress is likely to concentrate on the first metal layer 151 directly below the end 160a, and cracks are thus liable to occur in the first metal layer 151 in this portion.

Contrary to this, as shown in FIG. 11, it is conceivable that an entirety of an upper surface of each cell region 142 (a region surrounded by the trench 140) is covered with the interlayer insulating film 162 in a vicinity of the inner peripheral side end 160a of the insulating protective film 160 (that is, the contact holes 162a are not provided in the interlayer insulating film 162 in the vicinity of the end 160a). An upper surface of the interlayer insulating film 162 becomes flat in a range where the contact holes 162a are not provided. Due to this, the upper surface of the first metal layer 151 also becomes flat on the interlayer insulating film 162 in this range. That is, the recesses 151a are not present in the upper surface of the first metal layer 151 in this range. Accordingly, in this range, the first metal layer 151 is in contact with the second metal layer 152 at a flat surface. The restraining force of the second metal layer 152 upon the first metal layer 151 is weak at the flat surface. Due to this, the thermal expansion amount of the first metal layer 151 in the flat surface range is large compared to the thermal expansion amount of the first metal layer 151 in a range where the recesses 151a are present (notably, the thermal expansion amount of the first metal layer 151 even in this flat surface range is small compared to the thermal expansion amount of the first metal layer 151 in a range where the first metal layer 151 is in contact with the insulating protective film 160). As a result of this, a difference in thermal expansion amount of the first metal layer 151 between a range where the thermal expansion amount of the first metal layer 151 is small (range where the first metal layer 151 is in contact with the second metal layer 152) and a range where the thermal expansion amount of the first metal layer 151 is large (range where the first metal layer 151 is in contact with the insulating protective film 160) becomes small at a position directly below the end 160a of the insulating protective film 160. Due to this, this configuration reduces the thermal stress generated in the first metal layer 151 at the position directly below the end 160a, and suppresses the occurrence of the cracks in the first metal layer 151 at this portion.

However, according to the configuration of FIG. 11, there occurs a problem that a resistance of the second region 126 increases upon when the switching device turns on. The details will be explained hereinbelow. In FIG. 11, in each cell region 142 below the interlayer insulating film 162 in a range where no contact holes 162a are present the body region 124 is not connected to the upper electrode 150, and thereby a potential of the body region 124 is floating. Upon when the switching device turns off, a difference in potential between the second region 126 and the body region 124 becomes large. Then, a depletion layer extends from a pn junction at an interface between the second region 126 and the body region 124. This depletion layer depletes the second region 126 in a wide range. Further, this depletion layer partially depletes the body region 124 as well. When the depletion layer expands in the body region 124, a part of charges in the body region 124 (e.g., holes) is reunited with charges in the second region 126 (e.g., electrons) to disappear. Accordingly, as the depletion layer expands, the charges in the body region 124 reduce.

After that, when the potential of the gate electrode 130 is controlled to a gate-on potential, channel is formed in the body region 124 in a range adjacent to a gate insulating film 132. Then the potential of the second region 126 becomes substantially equal to a potential of first regions 122. Charges are then supplied from the upper electrode 150 to the body region 124 in a range where the body region 124 is connected to the upper electrode 150. Due to this, the depletion layer extending from the pn junction at the interface between the body region 124 and the second region 126 disappears. Accordingly, a current flows between the lower electrode 154 and the upper electrode 150.

Contrary to this, charges are not supplied from the upper electrode 150 to the body region 124 in the range where the body region 124 is floating (the region where no contact holes 162a are present). Due to this, even when the channel is formed, a state where the depletion layer extends in the second region 126 below the floating body region 124 is maintained. That is, even in an ON-state, as shown in FIG. 11, a depletion layer 159 expands from the floating body region 124 into the second region 126. Due to this, in this switching device a current path in the second region 126 is narrow and a resistance of the second region 126 is high in the ON-state. As such, the resistance of the second region 126 is high when the switching device turns on.

Notably, in FIGS. 9 to 11, the switching device including a collector region 128 (i.e., IGBT: Insulated Gate Bipolar Transistor) is described as an example. However, a similar problem may occur in a case of a FET (Field Effect Transistor), which does not include the collector region 128. The above-described problem may occur both in an n-channel type FET and a p-channel type FET. Further, in FIGS. 10 and 11, the electrode 154 is provided on a lower surface of the semiconductor substrate 118. However, the electrode 154 may be provided in other positions.

In FIG. 11, the problem of the floating body region 124 can be solved if the grid-shaped trench 140 is removed from below a portion of the interlayer insulating film 162 where the contact holes 162a are not present. However, if the grid-shaped trench 140 is locally removed, there may occur a problem that electric field concentrates in a periphery of the region where the grid-shaped trench 140 is removed, thereby decreasing the breakdown voltage of the switching device.

The present disclosure provides a technique that can suppress occurrence of cracks in a first metal layer below a side surface of an opening of an insulating protective layer, can ensure breakdown voltage of a switching device, and can reduce resistance of a second region when the switching device turns on.

A switching device disclosed herein comprises a semiconductor substrate, a gate insulating film, a gate electrode, an interlayer insulating film, a first metal layer, a second metal layer, and an insulating protective film. The semiconductor substrate comprises a first element range, and an ineffective range disposed in between the first element range and an outer peripheral end surface of the semiconductor substrate. A plurality of first trenches is provided in an upper surface of the semiconductor substrate. The first trenches extend in parallel to each other along a first direction across the first element range and the ineffective range. Hereinafter each region interposed between the first trenches in a plan view of the upper surface of the semiconductor substrate will be referred to as an inter-trench region. A plurality of second trenches is provided in the upper surface of each of the inter-trench regions within the first element range and is not provided within the ineffective range, and is spaced apart from each other in the first direction. Each second trench is connected to two of the first trenches located on both sides of the second trench itself. A width of the ineffective range in the first direction is greater than a pitch of the second trenches in the first direction. The gate insulating films covers inner surfaces of the first trenches and inner surfaces of the second trenches. The gate electrode is disposed across inner portions of the first trenches and the inner portions of the second trenches, and is insulated from the semiconductor substrate by the gate insulating film. The interlayer insulating film covers the upper surface and the gate electrode in a range across the first element range and the ineffective range. Within the first cell region, a contact hole is provided in a portion of the interlayer insulating film that covers the upper surface. Within the inactive region, a contact hole is not provided in the portion of the interlayer insulating film that covers the upper surface. The first metal layer covers the interlayer insulating film, is insulated from the gate electrode by the interlayer insulating film, and is in contact with the semiconductor substrate within the contact hole. A recess is provided on a surface of the first metal layer above the contact hole. The insulating protective film covers a portion of the first metal layer on an outer peripheral side within the ineffective range. An opening is provided in the insulating protective film in a range including the first element range and wider than the first element range, and a side surface of the opening is disposed within the ineffective range. The second metal layer is in contact with the surface of the first metal layer in the opening, and additionally in contact with the side surface of the opening. The second metal layer has a linear expansion coefficient smaller than a linear expansion coefficient of the first metal layer. Each inter trench region within the first element range comprises a first region and a body region. The first region is a region of a first conductivity type and is in contact with the first metal layer and the gate insulating film. The body region is a region of a second conductivity type, is in contact with the first metal layer, and is in contact with the gate insulating film below the first region. Each inter-trench region within the ineffective range comprises a second conductivity type peripheral region of the second conductivity type, and the second conductivity type peripheral region is connected to the body region. The semiconductor substrate comprises a second region of the first conductivity type. The second region is disposed across below the body region and below the second conductivity type peripheral region, is in contact with the gate insulating film below the body region, and is separated from the first region by the body region.

In this switching device, an entirety of the upper surface of the semiconductor substrate in the ineffective range is covered with the interlayer insulating film, and no contact hole is provided in the ineffective range. Thus, the upper surface of the interlayer insulating film in the ineffective range is flat. Due to this, the upper surface of the first metal layer on the interlayer insulating film is also flat in the ineffective range. In this switching device, the side surface of the opening of the insulating protective film (the inner peripheral side end of the insulating protective film) is positioned in the ineffective range (i.e., range where the upper surface of the first metal layer is flat). Due to this, similarly to the case of FIG. 8, thermal stress applied to the first metal layer at the position directly below the side surface of the opening of the insulting protective film is mitigated. Thus, on this switching device, cracks are less likely to occur at the position directly below the side surface of the opening of the insulating protective film.

Further, in this switching device, the second conductivity type peripheral region is provided in the semiconductor substrate in the ineffective range. The second conductivity type peripheral region is connected to the body region in the first element range. Since the second trenches are not provided in the ineffective range, the second conductivity type peripheral region in the ineffective range can be connected to the body region in the first element range in a vicinity of the upper surface of the semiconductor substrate. Due to this, a potential of the second conductivity type peripheral region is not floating, and is connected to the potential of the body region (i.e., a potential of the first metal layer). Upon when turning off the switching device, a depletion layer extends from a pn junction at an interface between the second conductivity type peripheral region and the second region. At this occasion, charges in the second conductivity type peripheral region decrease. Upon when turning on the switching device, charges are supplied to the second conductivity type peripheral region via the body region. Due to this, when the switching device turns on, the depletion layer that had extended from the pn junction at the interface between the second conductivity type peripheral region and the second region disappears. Accordingly, current become able to flow through the second region in a wide range. Due to this, when the switching device turns on, the resistance of the second region is low.

Further, as such even if the second trenches are removed from the ineffective range, the electric field concentration in the periphery of the ineffective range can be suppressed by the second conductivity type peripheral region and the first trenches in the ineffective range.

As described above, according to the switching device disclosed herein, occurrence of cracks in the first metal layer directly below the side surface of the opening of the insulating protective film can be suppressed. In addition, according to this switching device, the resistance of the second region upon when turning on the switching device can be reduced. Further, according to this switching device, the breakdown voltage of the switching device can be ensured since the electric field concentration in the periphery of the ineffective range is suppressed.

BRIEF DESCRIPTION OF DRAWINGS

FIG. 9 is a plan view of a switching device of comparative example 1.

FIG. 10 is a vertical cross sectional view of the switching device of comparative example 1, taken along line X-X of FIG. 9.

FIG. 11 is a vertical cross sectional view of the switching device of comparative example 2.

DETAILED DESCRIPTION

Embodiment 1

Figure 1:
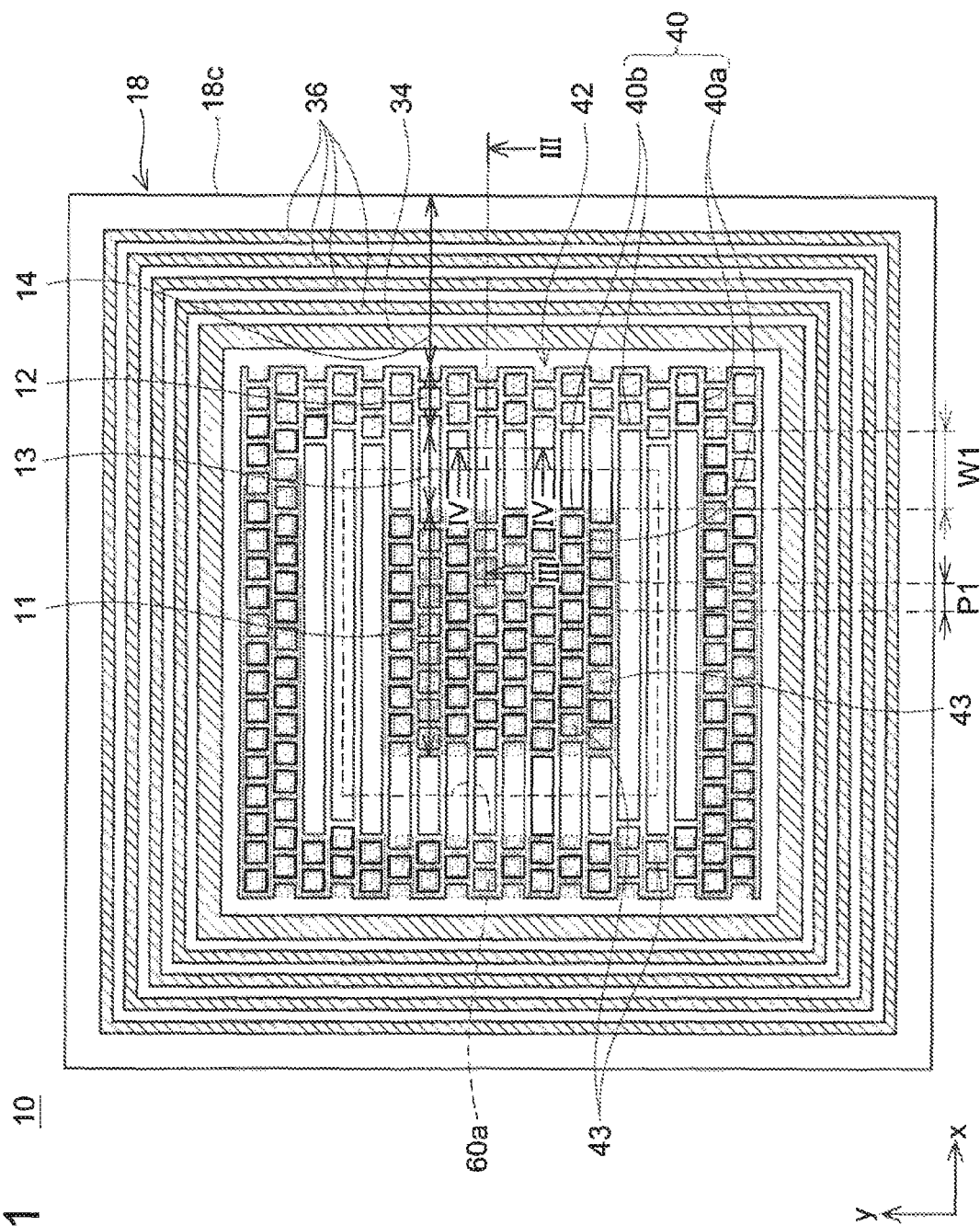
FIG. 1 is a plan view of an IGBT 10 of embodiment 1.
Figure 2:
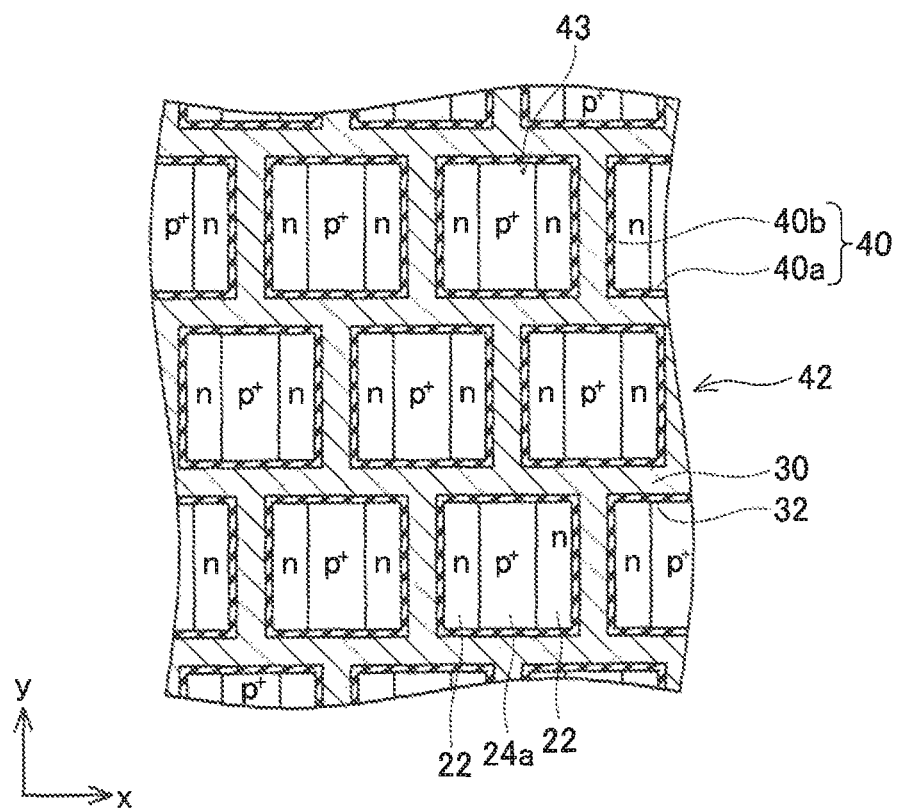
FIG. 2 is an enlarged view of an upper surface 18a of a semiconductor substrate 18.

An IGBT 10 of embodiment 1 shown in FIGS. 1 to 4, comprises a semiconductor substrate 18, electrodes each provided at an upper surface 18a and a lower surface 18b of the semiconductor substrate 18, and insulating films. Notably, in FIGS. 1 and 2, illustration of the electrode on the upper surface 18a of the semiconductor substrate 18 and the insulating films is omitted for easier explanation. Further, a direction parallel to the upper surface 18a of the semiconductor substrate 18 will be denoted as an X direction and a direction parallel to the upper surface 18a and perpendicular to the X direction will be denoted as a Y direction, hereinbelow.

As shown in FIG. 1, a trench 40 is provided in the upper surface 18a of the semiconductor substrate 18. The trench 40 comprises a plurality of first trenches 40a that extends along the X direction, and a plurality of second trenches 40b that extends along the Y direction. The first trenches 40a are parallel to each other. The first trenches 40a are arranged to be spaced apart from each other along the Y direction. Each region between two adjacent first trenches 40a will be hereinafter referred to as an inter-trench region 42. A plurality of second trenches 42b is arranged in each inter-trench region 42. Each second trench 40b is connected to the first trenches 40a disposed on both sides of the second trench 40b itself. A range where the trench 40 is disposed in a plan view of the upper surface 18a of the semiconductor substrate 18, will be hereinafter referred to as a trench range. The trench range includes a first element range 11, a surrounding range 13, and a second element range 12.

The first element range 11 is a shaded range in FIG. 1, and is provided at a substantially center of the semiconductor substrate 18. The first trenches 40a and the second trenches 40b are provided in the first element range 11. The first trenches 40a extending through the first element range 11 extend across the first element range 11, the surrounding range 13, and the second element range 12. The second trenches 40b are arranged to be spaced apart from each other along the X direction in respective inter-trench regions 42 in the first element range 11. The second trenches 40b are repeatedly provided at a constant pitch P1 along the X direction respectively in the inter-trench regions 42 in the first element range 11. A trench extending in a grid shape is formed by the first trenches 40a and the second trenches 40h in the first element range 11. The upper surface 18a of the semiconductor substrate 18 is partitioned into a multitude of rectangular regions by the trench extending in the grid shape.

The surrounding range 13 is provided on an outer peripheral side of the first element range 11 (i.e., between the first element range 11 and an outer peripheral end surface 18c of the semiconductor substrate 18). The surrounding range 13 surrounds a periphery of the first element range 11. In the surrounding range 13, the first trenches 40a are provided while the second trenches 40b are not provided. A width W1 in the X direction of the surrounding range 13 at a portion adjacent to the first element range 11 in the X direction (i.e., an interval between the first element range 11 and the second element range 12 in the X direction) is greater than twice the pitch P1 between each pair of two adjacent second trenches 40b in the X direction in the first element range 11.

The second element range 12 is a shaded range in FIG. 1, and is provided on the outer peripheral side of the surrounding range 13 (i.e., between the surrounding range 13 and the outer peripheral end surface 18c of the semiconductor substrate 18). The second element range 12 surrounds a periphery of the surrounding range 13. In the second element range 12, the first trenches 40a and the second trenches 40b are provided. In the second element range 12 in each inter-trench region 42, the second trenches 40b are arranged at constant intervals along the X direction. In each inter-trench region 42 in the second element range 12, the second trenches 40b are repeatedly provided at a pitch equal to the above-described pitch P1 (the pitch P1 of the second trenches 40h in the first element range 11). In the second element range 12, a trench extending in a grid shape is formed by the first trenches 40a and the second trenches 40b. The upper surface 18a of the semiconductor substrate 18 is partitioned into a multitude of rectangular regions by the trench extending in the grid-shape.

Notably, each of the rectangular semiconductor regions partitioned by the trench 40 in the first element range 11 and the second element range 12, will be hereinafter referred to as a element range 43.

An outer peripheral voltage resistant range 14 is provided on an outer peripheral side of the second element range 12 (i.e., between the second element range 12 and the outer peripheral end surface 18c of the semiconductor substrate 18). The outer peripheral voltage resistant range 14 is a range where the trench 40 is not provided. The outer peripheral voltage resistant range 14 surrounds the second element range 12.

Figure 3:
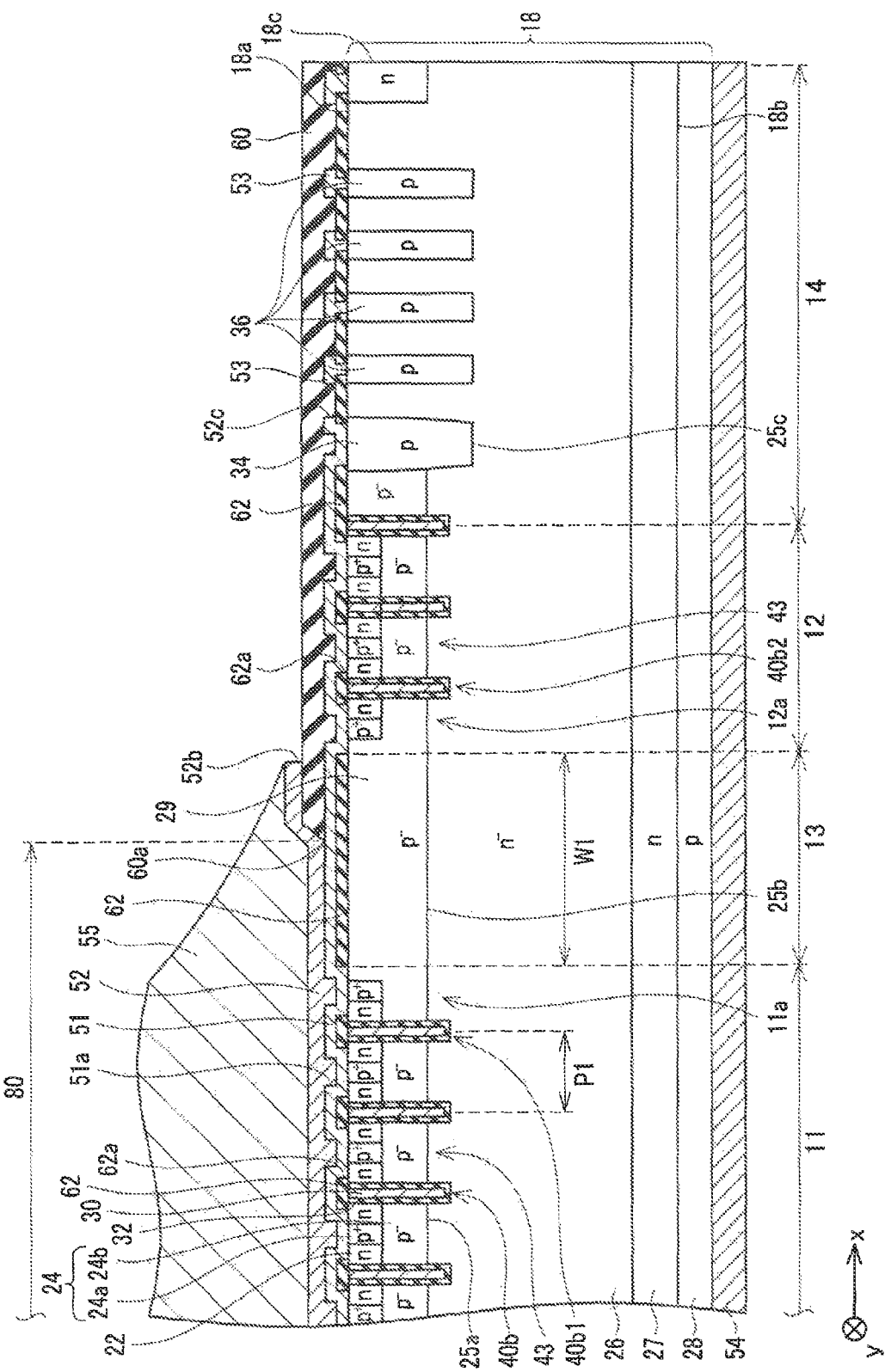
FIG. 3 is a vertical cross sectional view of the IGBT 10, taken along line of III-III of FIG. 1.
Figure 4:
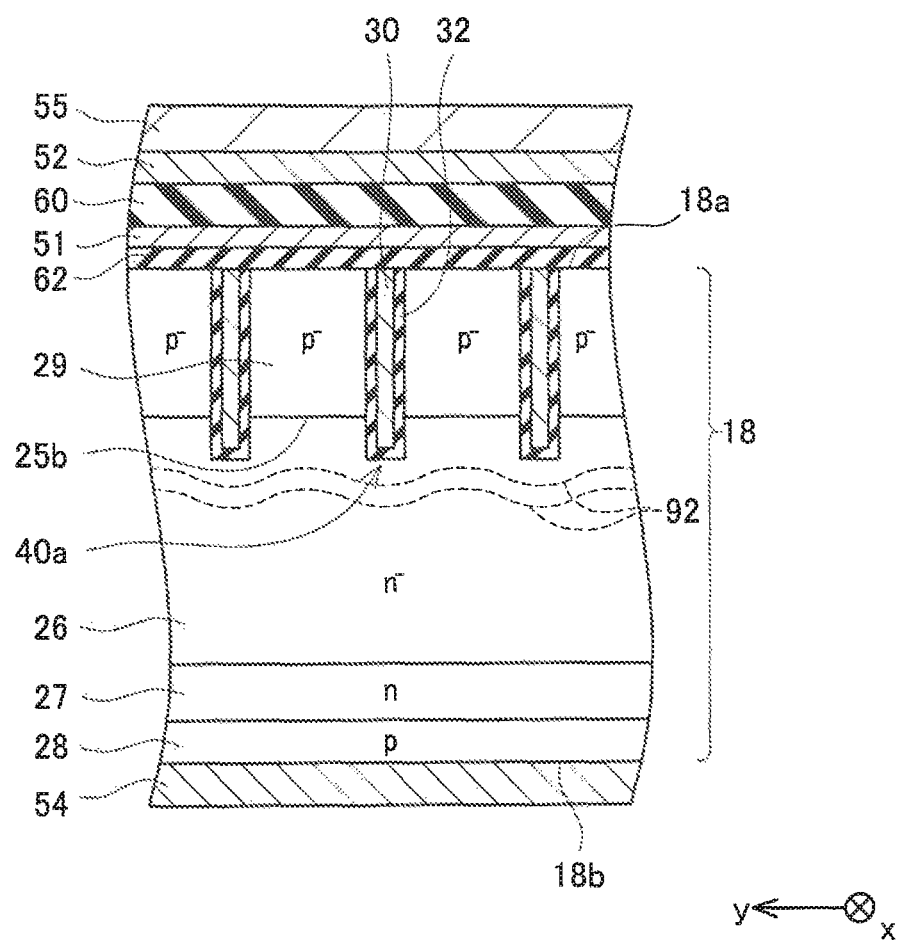
FIG. 4 is a vertical cross sectional view of the IGBT 10, taken along line of IV-IV of FIG. 1.

As shown in FIGS. 2 to 4, an inner surface of the trench 40 is covered with agate insulating film 32. Further, a gate electrode 30 is disposed inside the trench 40. The electrode 30 extends in a mesh shape corresponding to the trench 40 in the plan view of the upper surface 18a of the semiconductor substrate 18. The gate electrode 30 is insulated from the semiconductor substrate 18 by the gate insulating film 32.

As shown in FIGS. 2, 3, each cell region 43 in the first element range 11 includes emitter regions 22 and a body region 24.

Each emitter region 22 is an n-type region. Two emitter regions 22 are provided in each cell region 43 in the first element range 11. Each emitter region 22 is disposed in a range exposed on the upper surface 18a of the semiconductor substrate 18. The emitter regions 22 are in contact with the gate insulating film 32 at an uppermost portion of the trench 40.

The body region 24 is a p-type region. The body region 24 is exposed on the upper surface 18a of the semiconductor substrate 18 in a range where no emitter regions 22 are present. The body region 24 extends from the position exposed on the upper surface 18a to a position below the emitter regions 22. The body region 24 includes high density regions 24a and a low density region 24b that has a lower p-type impurity density than the high density regions 24a. Each high density region 24a is disposed in a range exposed on the upper surface 18a. The low density region 24b is disposed below the emitter regions 22. The low density region 24b is in contact with the gate insulating film 32 at below the emitter regions 22.

As shown in FIG. 3, the above-described emitter regions 22 and the body region 24 are also provided in a semiconductor region 11a, which is adjacent to a second trench 40b1 on a surrounding area 13 side, the second trench 40b1 being a second trench that is positioned closest to the surrounding range 13 in the first element range 11. Also in the semiconductor region 11a, the emitter region 22 is exposed on the upper surface 18a of the semiconductor substrate 18, and is in contact with the gate insulating film 32 at the uppermost portion of the trench 40. Further, also in the semiconductor region 11a, the high density regions 24a of the body region 24 is exposed on the upper surface 18a of the semiconductor substrate 18. Further, also in the semiconductor region 11a, the low density region 24b of the body region 24 is in contact with the gate insulating film 32 at below the emitter region 22.

Each cell region 43 in the second element range 12 also includes the emitter regions 22 and the body region 24. The emitter regions 22 and the body region 24 in the second element range 12 have the same configurations as those of the emitter regions 22 and the body region 24 in the first element range 11 respectively.

The above-described emitter regions 22 and the body region 24 are also provided in a semiconductor region 12a, which is adjacent to a second trench 40b2 on the surrounding area 13 side, the second trench 40b2 being a second trench that is positioned closest to the surrounding range 13 in the second element range 12.

As shown in FIGS. 3 and 4, a p-type peripheral region 29 is provided in each inter-trench region 42 in the surrounding range 13. The p-type peripheral regions 29 are provided in ranges exposed on the upper surface 18a of the semiconductor substrate 18 in the surrounding range 13. Each p-type peripheral region 29 is a p-type region having a p-type impurity density substantially equal to the p-type impurity density of the low density regions 24b of the body regions 24. The p-type peripheral regions 29 extend from the upper surface 18a of the semiconductor substrate 18 to a substantially equal depth to a depth of lower ends of the body regions 24. As shown in FIG. 4, the lower end of each p-type peripheral region 29 is positioned higher than the lower end of each first trench 40a. As shown in FIG. 4, each p-type peripheral region 29 is separated by the corresponding first trench 40a from another p-type peripheral region 29 next to that p-type peripheral region 29 in the Y direction. Further, as described above, no second trench 40b is present in the surrounding range 13. Therefore, as shown in FIG. 3, each p-type peripheral region 29 is connected to the low density regions 24b (i.e., the respective low density regions 24b in the semiconductor regions 11a and 12a) of the body regions 24 adjacent to the p-type peripheral region 29 in the X direction.

As shown in FIGS. 1 and 3, a terminal region 34 and a plurality of guard rings 36 are provided in the outer peripheral voltage resistant range 14.

The terminal region 34 is a p-type region, and is positioned in a range exposed on the upper surface 18a of the semiconductor substrate 18. The terminal region 34 extends from the upper surface 18a to a lower side than the lower end of the trench 40. The terminal region 34 extends in an annular shape to surround the trench range (i.e., the first element range 11, the surrounding range 13, and the second element range 12).

Each guard ring 36 is a p-type region, and is positioned in a range exposed on the upper surface 18a of the semiconductor substrate 18. Each guard ring 36 extends from the upper surface 18a to the lower side than the lower end of the trench 40. The terminal range 34 is surrounded by the multiple guard rings 36. That is, each guard ring 36 extends in the annular shape to surround the trench range. Each guard ring 36 is separated from the body regions 24 and the terminal region 34. Further, the respective guard rings 36 are separated from each other.

As shown in FIGS. 3, 4, the semiconductor substrate 18 includes a drift region 26, a buffer region 27, and a collector region 28.

The drift region 26 is an n-type region having a low n-type impurity density. The drift region 26 extends across the first element range 11, the surrounding range 13, the second element range 12, and the outer peripheral voltage resistant range 14. Within the first element range 11, the drift region 26 is disposed below the body region 24 and is in contact with the body region 24 from below the body region 24. Within the first element range 11, the drift region 26 is separated from the emitter regions 22 by the body region 24. Within the first element range 11, the drift region 26 is in contact with the gate insulating film 32 at below the body region 24. Within the surrounding range 13, the drift region 26 is disposed below the p-type peripheral regions 29 and is in contact with the p-type peripheral regions 29 from below the p-type peripheral regions 29. Within the second element range 12, the drift region 26 is disposed below the body region 24, and is in contact with the body region 24 from below the body region 24. Within the second element range 12, the drift region 26 is separated from the emitter regions 22 by the body region 24. Within the second element range 12, the drift region 26 is in contact with the gate insulating film 32 below the body region 24. Within the outer peripheral voltage resistant range 14, the drift region 26 is in contact with the terminal region 34 and the respective guard rings 36. The terminal region 34 is separated from the guard rings 36 by the drift region 26. Further, the respective guard rings 36 are separated from each other by the drift region 26.

The buffer region 27 is an n-type region having a higher n-type impurity density than the drift region 26. The buffer region 27 extends across the first element range 11, the surrounding range 13, the second element range 12, and the outer peripheral voltage resistant range 14. The buffer region 27 is disposed below the drift region 26, and is in contact with the drift region 26 from below the drift region 26.

The collector region 28 is a p-type region. The collector region 28 extends across the first element range 11, the surrounding range 13, the second element range 12, and the outer peripheral voltage resistant range 14. The collector region 28 is disposed below the buffer region 27, and is in contact with the buffer region 27 from below the buffer region 27. The collector region 28 is exposed on the lower surface 18b of the semiconductor substrate 18.

As shown in FIGS. 3, 4, an interlayer insulating film 62, an ohmic metal layer 51, a plurality of ring electrodes 53, an insulating protective film 60, and a surface metal layer 52 are arranged above the semiconductor substrate 18.

The interlayer insulating film 62 is disposed on the upper surface 18a of the semiconductor substrate 18. The interlayer insulating film 62 extends across the first element range 11, the surrounding range 13, the second element range 12, and the outer peripheral voltage resistant range 14. An entirety of an upper surface of the gate electrode 30 is covered with the interlayer insulating film 62. A contact hole 62a piercing the interlayer insulating film 62 in a vertical direction is provided on each of the cell regions 43 within the first element range 11 and the second element range 12. No contact holes are provided within the surrounding range 13. An entirety of the upper surface 18a of the semiconductor substrate 18 within the surrounding range 13 is covered with the interlayer insulating film 62. In other words, the surrounding range 13 is a range where no second trenches 40b are present, and no contact holes are provided in the interlayer insulating film 62. Contact holes are provided in the interlayer insulating film 62 within the outer peripheral voltage resistant range 14 above the terminal region 34 and above the respective guard rings 36 and the like.

The ohmic metal layer 51 covers the interlayer insulating film 62 in the first element range 11, the surrounding range 13, and the second element range 12. The ohmic metal layer 51 extends along a surface of the interlayer insulating film 62 and the upper surface 18a of the semiconductor substrate 18, and has a substantially constant thickness. Thus, an upper surface of the ohmic metal layer 51 is recessed following the contact holes 62a within the first element range 11 and the second element range 12. That is, recesses 51a are provided on the surface of the ohmic metal layer 51 above the respective contact holes 62a. The ohmic metal layer 51 is in contact with the upper surface 18a of the semiconductor substrate 18 in each contact hole 62a. The ohmic metal layer 51 is in ohmic contact with the emitter regions 22 and the high density region 24a of the body region 24 in each contact hole 62a. Since the contact holes 62a are not provided in the interlayer insulating film 62 in the surrounding range 13, the upper surface of the ohmic metal layer 51 is flat in the surrounding range 13. Further, a part of the ohmic metal layer 51 extends up to above the terminal region 34. The ohmic metal layer 51 is in ohmic contact with the terminal region 34 in the contact hole above the terminal region 34. The ohmic metal layer 51 is constituted of AlSi (alloy of aluminum and silicon).

The respective ring-electrodes 53 are disposed on the respective guard rings 36. The ring-electrodes 53 extend in an annular shape along the guard rings 36. Each ring-electrode 53 is in ohmic contact with the corresponding guard ring 36 within the contact hole above the guard ring 36.

The insulating protective film 60 is disposed on the ohmic metal layer 51, the interlayer insulating film 62 and the ring-electrodes 53 within the second element range 12 and within the outer peripheral voltage resistant range 14. Entire surfaces of the second element range 12 and the outer peripheral voltage resistant range 14 are covered with the insulating protective film 60. A part of the insulating protective film 60 extends over to the surrounding range 13. Within the surrounding range 13, the insulating protective film 60 is disposed on the ohmic metal layer 51. The insulating protective film 60 covers an outer peripheral portion of the ohmic metal layer 51 within the surrounding range 13. The insulating protective film 60 has an opening 80 at a center of the upper surface 18a of the semiconductor substrate 18. The opening 80 is provided in a range broader than the first element range 11 that includes the first element range 11. That is, the entirety of the first element range 11 and an inner peripheral portion of the surrounding range 13 are positioned within the opening 80. As shown in FIGS. 1, 3, an inner peripheral side end 60a of the insulating protective film 60 (i.e., a side surface of the opening 80) is positioned within the surrounding range 13. The insulating protective film 60 is constituted of resin (e.g., polyimide). A linear expansion coefficient of the insulating protective film 60 is slightly greater than a linear expansion coefficient of the ohmic metal layer 51 (i.e., AlSi).

The surface metal layer 52 covers the surface of the ohmic metal layer 51 in a range not covered with the insulating protective film 60 (i.e., an inner peripheral portion of the ohmic metal layer 51 within the surrounding range 13, and the ohmic metal layer 51 in the first element range 11). The surface metal layer 52 is filled in each recess 51a within the first element range 11. A part of the surface metal layer 52 on the outer peripheral side extends to above the insulating protective film 60. Thus, the surface metal layer 52 is in contact with the insulating protective film 60 at the inner peripheral side end 60a of the insulating protective film 60 (i.e., side surface of the opening 80). The surface metal layer 52 is constituted of Nickel. The surface metal layer 52 (i.e., Nickel) has a high solder wettability. The linear expansion coefficient of the surface metal layer 52 (i.e., Nickel) is smaller than the linear expansion coefficient of the ohmic metal layer 51 (i.e., AlSi). A soldering layer 55 is bonded to the surface metal layer 52. The surface metal layer 52 is connected by the soldering layer 55 to a metal block not shown.

A lower electrode 54 is disposed in the lower surface 18b of the semiconductor substrate 18. The lower electrode 54 is in ohmic contact with the collector region 28.

Next, operation of the IGBT 10 will be described. The IGBT 10 is used in a state where a voltage that makes the lower electrode 54 have a higher potential is applied between the ohmic metal layer 51 and the lower electrode 54. When a potential higher than a threshold voltage is applied to the gate electrode 30, channels are formed in the body regions 24 in ranges adjacent to the gate insulating film 32. The channels connect the emitter regions 22 and the drift region 26. Accordingly, electrons flow from the ohmic metal layer 51 to the lower electrode 54 through the emitter regions 22, the channels, the drift region 26, the buffer region 27, and the collector region 28. Further, holes flow from the lower electrode 54 to the ohmic metal layer 51 through the collector region 28, the buffer region 27, the drift region 26, and body regions 24. That is, the IGBT 10 turns on and current flows from the lower electrode 54 to the ohmic metal layer 51.

When the potential of the gate electrode 30 is decreased to a lower potential than the threshold voltage, the channels disappear. Then, a reverse voltage is applied to pa junctions 25a at interfaces between the body regions 24 and the drift region 26. Due to this, depletion layers extend from the pn junctions 25a to the body regions 24 and the drift region 26. Since the n-type impurity density of the drift region 26 is extremely low, the drift region 26 is depleted in a wide range. Further, when the depletion layers spread in the body regions 24, holes existing in the depleted range are reunited with electrons in the drift region 26 to disappear. Thus, as the depletion layers spread, the holes existing in the body regions 24 decrease.

Further, within the surrounding range 13, reverse voltage is applied to pn junctions 25b of interfaces between the p-type peripheral regions 29 and the drift region 26. Due to this, depletion layers extends from the pn junctions 25b to the p-type peripheral regions 29 and the drift region 26. The drift region 26 is depleted by the depletion layers extending from the pn junctions 25b as well. Further, as the depletion layers extend to the p-type peripheral regions 29, holes that exist in the depleted region are reunited with electrons in the drift region 26 to disappear. Thus, as the depletion layers extend, the holes that exist in the p-type peripheral regions 29 decrease.

Further, within the outer peripheral voltage resistant range 14, reverse voltage is applied to a pn junction 25c at an interface between the terminal region 34 and the drift region 26. Due to this, a depletion layer extends from the pn junction 25c to the terminal region 34 and the drift region 26. When the depletion layer extending from the pn junction 25c to the drift region 26 reaches a first guard ring 36, which is positioned on the innermost peripheral side, the depletion layer extends from the first guard ring 36 to the drift region 26 around that first guard ring 36. When the depletion layer extending from the first guard ring 36 to the drift region 26 reaches a second guard ring 36, which is positioned next to the first guard ring 36, then the depletion layer extends from the second guard ring 36 to the drift region 26 around that second guard ring 36. As such, within the outer peripheral voltage resistant range 14, the depletion layer extends to the outer peripheral side via the plurality of guard rings 36. Due to this, within the outer peripheral voltage resistant range 14, the drift region 26 is depleted over to a vicinity of the outer peripheral end surface 18c of the semiconductor substrate 18.

As explained above, if the potential of the gate electrode 30 is lowered to a potential lower than the threshold voltage, the channels disappear, thereby depleting the drift region 26 in a wide range. The body regions 24 are separated from the buffer region 27 by the depletion layers. Due to this, when the potential of the gate electrode 30 is lowered to a potential lower than the threshold voltage, the current flowing in the IGBT 10 is stopped. That is, the IGBT 10 is turned off.

Figure 5:
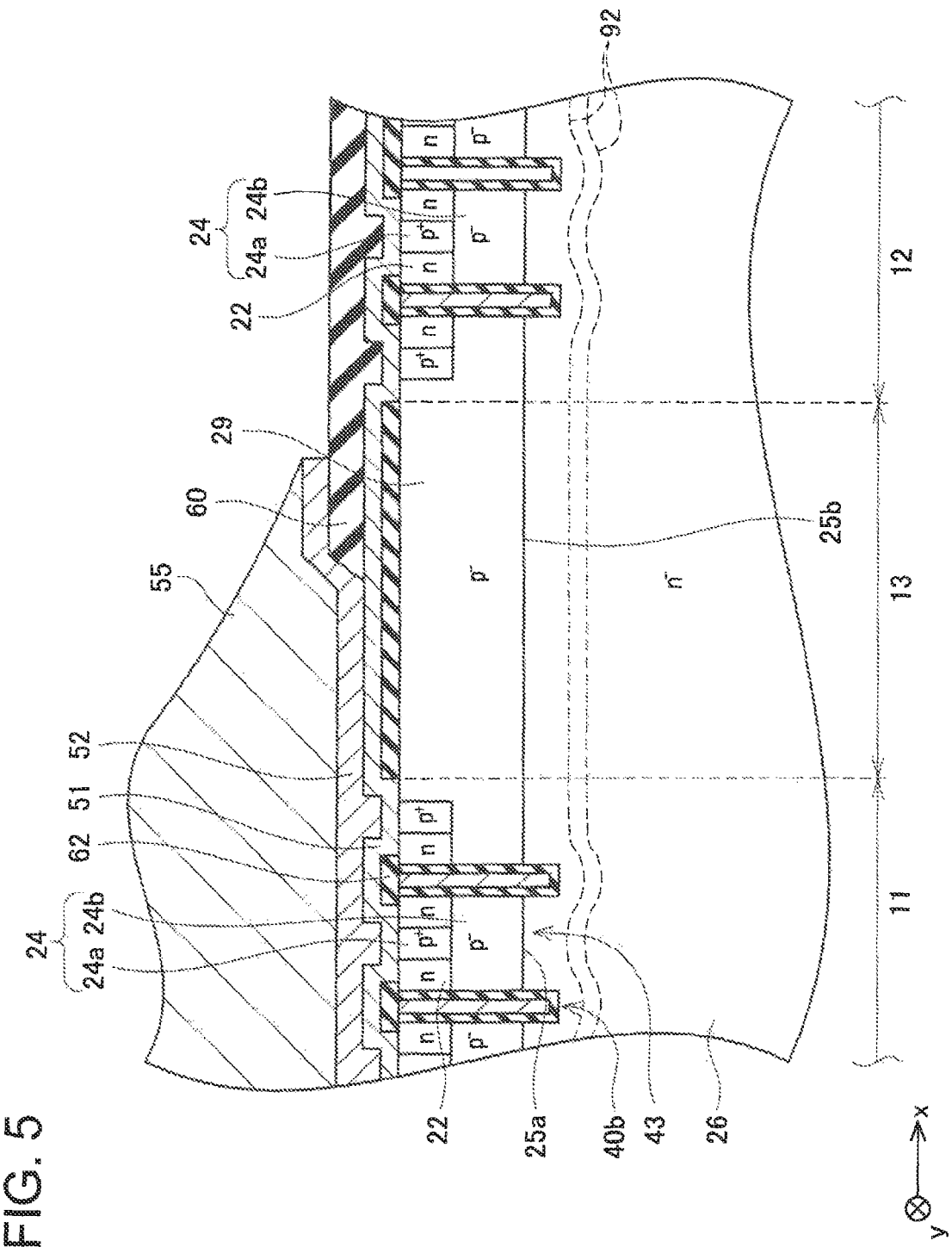
FIG. 5 is an enlarged view around a p-type peripheral region 29 of FIG. 3.

Equipotential lines 92 in FIGS. 4, 5 show an electric potential distribution within the drift region 26 in a state where the IGBT 10 is off. The drift region 26 is depleted in an entire range shown in FIGS. 4, 5. Further, although the p-type peripheral regions 29 and the body regions 24 are partially depleted in vicinities of the lower ends thereof, most of the p-type peripheral regions 29 and the body regions 24 are not depleted.

As shown in FIG. 5, in the first element range 11 and the second element range 12, the trench 40 (i.e., the first trenches 40a and the second trenches 40b) protrudes to be lower than the lower ends of the body regions 24, the equipotential lines 92 shift downward at portions below the trench 40 compared to portions below the body regions 24. It should be noted that since the potential of the body regions 24 is substantially equal to the potential of the gate electrode 30 and a difference in depth between the lower ends of the body regions 24 and the lower end of the gate electrode 30 is small, a difference in depth of the equipotential lines 92 between the portions below the body regions 24 and the portion below the gate electrode 30 is not significantly large.

As shown in FIGS. 4, 5, in the surrounding range 13, the p-type peripheral regions 29 extend to the depth substantially equal to the depth of the body regions 24. Further, in the surrounding range 13, no second trenches 40b are present while the first trenches 40a protrude to be lower than the lower ends of the p-type peripheral regions 29. The positions of the lower ends of the first trenches 40a in the surrounding region 13 are substantially equal to the positions of the lower ends of the first trenches 40a and the lower ends of the second trenches 40b in the first element range 11 and the second element range 12. Due to this, the equipotential lines 92 exist also in the surrounding range 13 at a depth substantially equal to a depth of the equipotential lines 92 of the first element range 11 and a depth of the equipotential lines 92 of the second element range 12. The equipotential lines 92 shift downward at portions below the first trenches 40a compared to the equipotential lines 92 below the p-type peripheral regions 29. Since the potential of the p-type peripheral regions 29 is substantially equal to the potential of the gate electrode 30 and a difference in depth between the lower ends of the p-type peripheral regions 29 and the lower end of the gate electrode 30 is small, a difference in depth of the equipotential lines 92 between the portions below the p-type peripheral regions 29 and the portion below the gate electrode 30 is not significantly large.

As such, since the difference in depth of the equipotential lines 92 is not likely to be generated between the first element range 11, the second element range 12, and the surrounding element range 13, in this IGBT 10, the electric field concentration is suppressed in the surrounding range 13 and its peripheries.

When the IGBT 10 is again turned from the OFF state to a state where the potential of the gate electrode 30 is raised to a potential higher than its threshold voltage, channels are formed in the body regions 24 and the potential of the drift region 26 decreases. Then holes are supplied from the ohmic metal layer 51 to the body regions 24. Due to this, the depletion layers that had extended from the pn junctions 25a at the interfaces between the body regions 24 and the drift region 26 shrink and disappear. Due to this, electrons and holes become able to flow in the drift region 26, and thus the IGBT 10 is turned on.

Further, when the potential of the drift region 26 is decreased, holes are supplied from the ohmic metal layer 51 to the p-type peripheral regions 29 via the body regions 24. Due to this, the depletion layers that had extended from the pn junctions 25b at the interfaces between the p-type peripheral regions 29 and the drift region 26 shrink and disappear. Accordingly, electrons and holes become able to flow also in the drift region 26 below the p-type peripheral regions 29. Due to this, a width of a portion of the drift region 26 where the electrons and the holes can flow becomes larger, the resistance of the drift region 26 decreases. Accordingly, a steady loss is not likely to be generated, and ON voltage is small in this IGBT 10.

Further, by the IGBT 10 repeating to turn ON and OFF, the temperature of the semiconductor substrate 18 repeatedly changes. Due to this, the temperatures of the ohmic metal layer 51, the surface metal layer 52, and the insulating protective film 60 above the semiconductor substrate 18 repeatedly change as well.

The ohmic metal layer 51 thermally expands along with the surface metal layer 52 in the range where the ohmic metal layer 51 is in contact with the surface metal layer 52 (i.e., the first element range 11 and an inner peripheral portion of the surrounding range 13). As described above, the linear expansion coefficient of the surface metal layer 52 (i.e., Nickel) is smaller than the linear expansion coefficient of the ohmic metal layer 51 (i.e., AlSi). Due to this, the thermal expansion of the ohmic metal layer 51 is suppressed in this range. Since the surface metal layer 52 is filled in each recess 51a in the upper surface of the ohmic metal layer 51 in the first element range 11, the ohmic metal layer 51 is firmly restrained by the surface metal layer 52. Due to this, thermal expansion amount of the ohmic metal layer 51 in the first element range 11 is small. On the other hand, the recesses 51a are not provided in the upper surface of the ohmic metal layer 51 in the surrounding range 13 in the range where the ohmic metal layer 51 and the surface metal layer 52 are in contact with each other (i.e., the inner peripheral side of the surrounding range 13), and thus the upper surface of the ohmic metal layer 51 is flat. Due to this, restraint force of the surface metal layer 52 on the ohmic metal layer 51 on the inner peripheral side of the surrounding range 13 is small compared to the restraint force of the surface metal layer 52 on the ohmic metal layer 51 in the first element range 11. Accordingly, the thermal expansion amount of the ohmic metal layer 51 is larger in this range than the thermal expansion amount of the ohmic metal layer 51 in the first element range 11.

The ohmic metal layer 51 thermally expands along with the insulating protective film 60 in the range where the ohmic metal layer 51 is in contact with the insulating protective film 60 (i.e., on an outer peripheral side of the surrounding range 13, the second element range 12, and the outer peripheral voltage resistant range 14). As described above, the linear expansion coefficient of the insulating protective film 60 (i.e., polyimide) is slightly larger than the linear expansion coefficient of the ohmic metal layer 51 (i.e., AlSi). Due to this, in this range the ohmic metal layer 51 has the largest thermal expansion amount within a range shown in FIG. 3.

As described above, in the IGBT 10 of embodiment 1, the inner peripheral side end 60a of the insulating protective film 60 (i.e., the side surface of the opening 80) is positioned in the surrounding range 13 (i.e., on the ohmic metal layer 51 having a flat upper surface). Due to this, a portion of the ohmic metal layer 51 having a relatively large thermal expansion amount (i.e., the inner peripheral side of the surrounding range 13) is adjacent to a portion of the ohmic metal layer 51 having the largest thermal expansion amount (i.e., the outer peripheral side of the surrounding range 13). Due to this, a difference in the thermal expansion amount of the ohmic metal layer 51 is not significantly large around the inner peripheral side end 60a of the insulating protective film 60. Due to this, an extremely large stress is not likely to be generated in the ohmic metal layer 51 below the end 60a. Accordingly, occurrence of cracks in the ohmic metal layer 51 below the end 60a is suppressed. The IGBT 10 of embodiment 1 has a high reliability.

Notably, in the IGBT 10 of embodiment 1, the surface metal layer 52 is formed by sputtering (hereinbelow referred to as a mask sputtering) through a stencil mask (mask plate prepared separately from the semiconductor substrate 18). Since high precision cannot be achieved by the mask sputtering, fluctuation in positions of an outer peripheral side end 52b of the surface metal layer 52 in FIG. 3 is large. If the outer peripheral side end 52b of the surface metal layer 52 extends toward the outer peripheral side than an outer peripheral side end 52c of the ohmic metal layer 51, a potential distribution in the drift region 26 in the outer peripheral voltage resistant range 14 is disturbed, and breakdown voltage of the IGBT 10 decreases. Further, if the outer peripheral side end 52b of the surface metal layer 52 is positioned on an inner peripheral side than the inner peripheral side end 60a of the insulating protective film 60, the ohmic metal layer 51 is exposed, leading to a lower reliability of the IGBT 10. Accordingly, a wide interval may preferably be provided between the outer peripheral side end 52c of the ohmic metal layer 51 and the inner peripheral side end 60a of the insulating protective film 60, and the outer peripheral side end 52b of the surface metal layer 52 may preferably be arranged in the wide interval. In this design, by providing the second element range 12 (i.e., range operating as a switching device) between the outer peripheral side end 52c of the ohmic metal layer 51 and the surrounding range 13, the semiconductor substrate 18 can be effectively utilized, and current capacity of the IGBT 10 can be increased.

Embodiment 2

In a process of manufacturing the IGBT 10, the first trenches 40a and the second trenches 40b can be formed by etching the upper surface 18a of the semiconductor substrate 18. At this occasion, since the second trenches 40b are not formed in the surrounding range 13, the surrounding range 13 includes a less area to be etched compared to the first element range 11 and the second element range 12. Accordingly, a density of not-reacted etching gas becomes high within the surrounding range 13, and an etching speed becomes fast in a region where the first trenches 40a are to be formed within the surrounding range 13. Due to this, the first trenches 40a within the surrounding range 13 may become slightly deeper than the first trenches 40a in the first element range 11 and the second element range 12. If in the configuration of embodiment 1 the first trenches 40a become locally deeper, the electric field becomes likely to concentrate in vicinities of the deeper first trenches 40a, despite such a concentration being minute. In embodiment 2, even in the case where the first trenches 40a become locally deeper, the electric field concentration can be suppressed.

Figure 6:
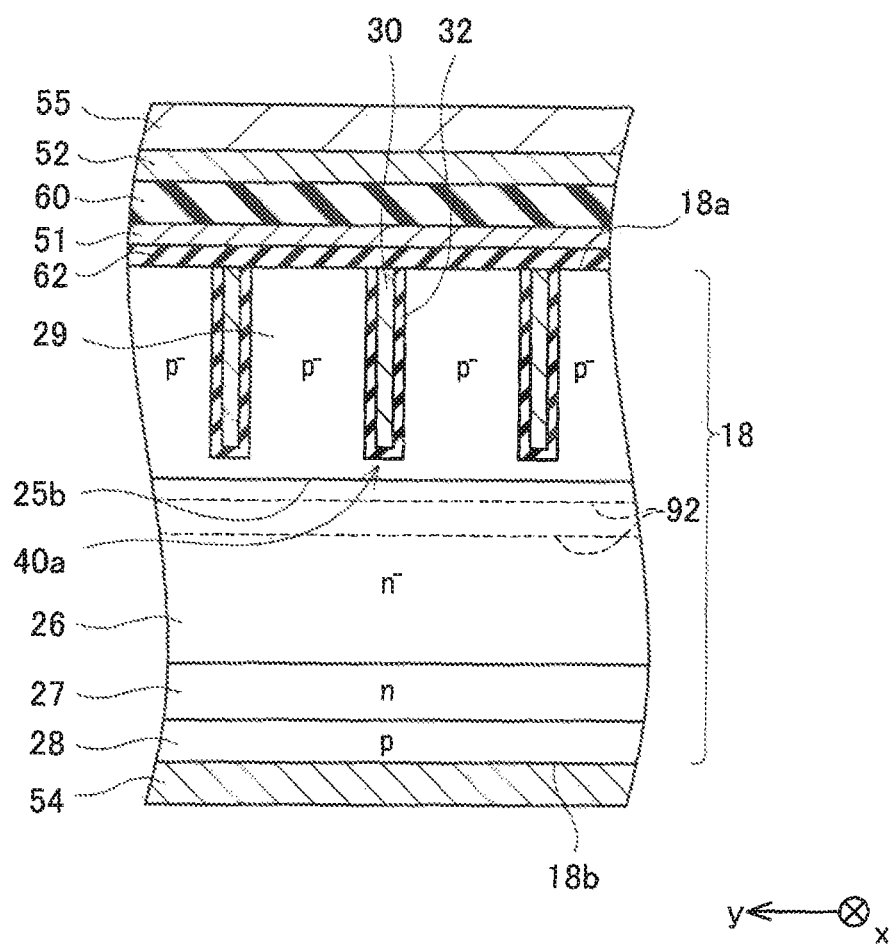
FIG. 6 is a vertical cross sectional view of an IGBT of embodiment 2 corresponding to FIG. 4.
Figure 7:
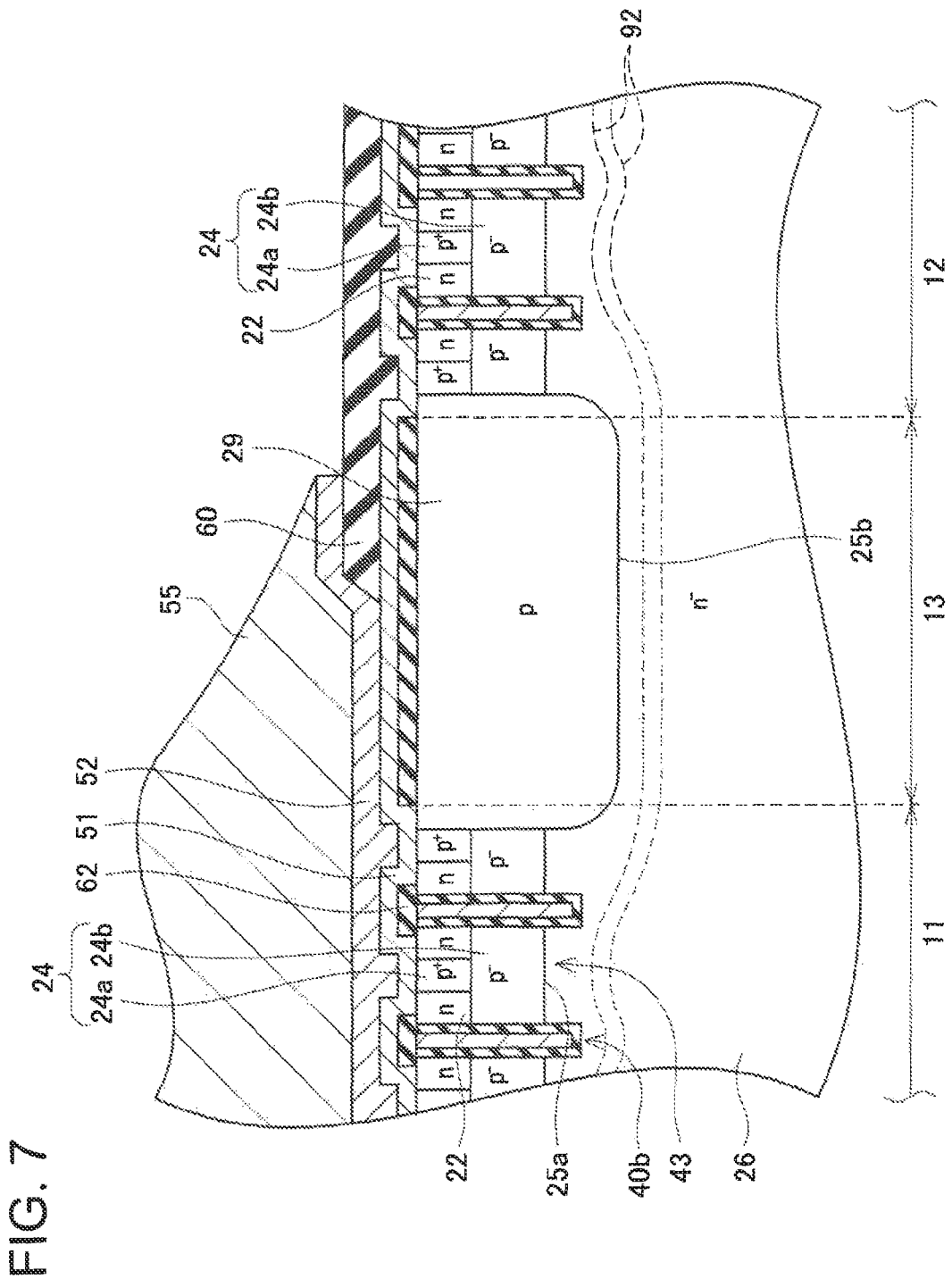
FIG. 7 is a vertical cross sectional view of the IGBT of embodiment 2 corresponding to FIG. 5.

In an IGBT of embodiment 2, as shown in FIGS. 6 and 7, a p-type peripheral region 29 extends to a deeper position than the body regions 24. Further, the p-type peripheral region 29 has a higher p-type impurity density than the lower density regions 24b of the body regions 24. The other configurations of the IGBT 10 of embodiment 2 are similar to those of the IGBT 10 of embodiment 1.

In this configuration, the p-type peripheral region 29 extends to a position deeper than the first trenches 40a. Due to this, adjacent p-type peripheral regions 29 are connected to each other below the first trenches 40a. That is, the first trenches 40a do not pierce the p-type peripheral region 29. In this configuration, as shown in FIGS. 6 and 7, when the IGBT is turned off, the equipotential lines 92 extend linearly in a transverse direction along the lower end of the p-type peripheral region 29 below the p-type peripheral region 29. In this configuration, the distribution of the equipotential lines 92 is not influenced by the depth of the first trenches 40a. Thus, the electric field concentration can stably be suppressed regardless of the depth of the first trenches 40a.

Further, in embodiment 2, the p-type peripheral region 29 has a higher p-type impurity density than the lower density regions 24b of the body regions 24. Accordingly, a depletion layer is difficult to extend in the p-type peripheral region 29. If the depletion layer reaches the first trenches 40a in the p-type peripheral region 29, the potential distribution in the depletion layer is influenced by the first trenches 40a. That is, the potential distribution in the depletion layer is influenced by the depth of the first trenches 40a. The potential distribution in the depletion layer comes to be less influenced by the depth of the first trenches 40a by having the p-type impurity density of the p-type peripheral region 29 high as in embodiment 2.

Figure 8:
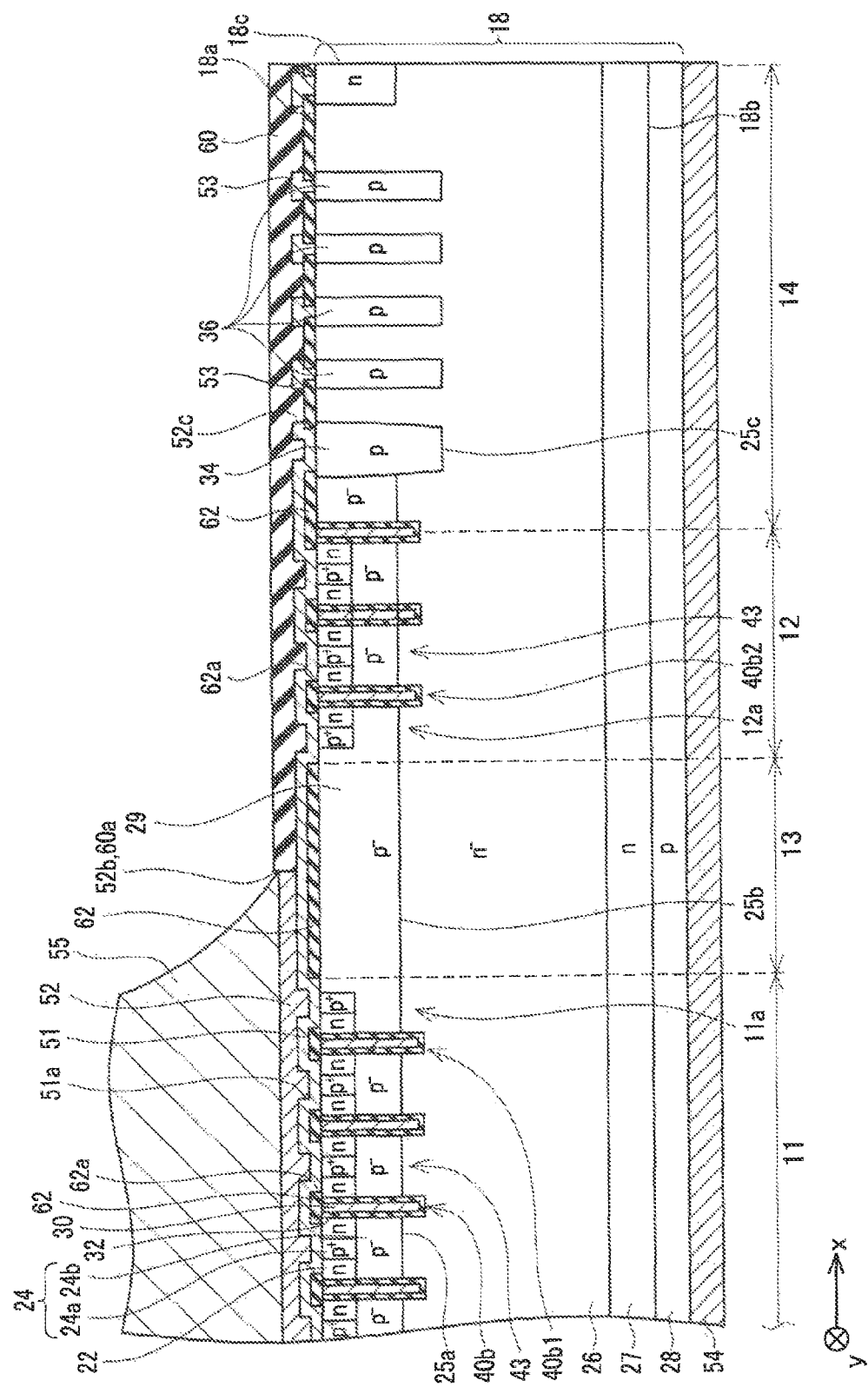
FIG. 8 is a vertical cross sectional view of an IGBT of a corresponding to FIG. 3.

Notably, in the above-described embodiments 1 and 2, the surface metal layer 52 is formed by mask sputtering. However, the surface metal layer 52 may be formed by plating. In this case, as shown in FIG. 8, the outer side end 52b of the surface metal layer 52 makes contact with the inner side end 60a of the insulating protective film 60 (i.e., side surface of the opening 80) without extending to above the insulating protective film 60. This configuration as well may bring the same advantageous effect as that in the above-described embodiments.

Further, in the above-described embodiments 1 and 2, the IGBT is explained. Alternatively, the technique disclosed herein may be applied to other switching devices including MOSFET. By providing an n-type region (drain region) which is in ohmic contact with the lower electrode 54, instead of the collector region 28 of the embodiments, an n-channel type MOSFET can be obtained. Further, a p-channel type MOSFET can be obtained by reversing the n-type regions and the p-type regions in the n-channel type MOSFET Corresponding relationships of the constituent features of the semiconductor device of the above-described embodiments and the constituent features of the claims will be described. The ohmic metal layer 51 in the embodiments is one example of a first metal layer in the claims. The surface metal layer 52 of the embodiments is one example of a second metal layer in the claims. The emitter region 22 of the embodiments is one example of a first region in the claims. The drift region 26 of the embodiments is one example of a second region in the claims. The p-type peripheral region 29 of the embodiments is one example of a second conductivity-type peripheral region in the claims.

The portion of the surrounding range 13 that is adjacent to the first cell range 11 in the x direction in the embodiments is one example of an inactive region in the claims.

Some technical elements disclosed herein will be listed. Notably, each of the following technical elements is useful independently.

In a configuration example of the present disclosure, a lower end of the second conductivity type peripheral region is positioned lower than lower ends of the first trenches in the ineffective range.

According to this configuration, the breakdown voltage of the switching device becomes less affected by the depth of the first trenches.

In a configuration example of the present disclosure, the second-conductivity type impurity density of the second conductivity type peripheral region may be higher than the second-conductivity type impurity density of the portion of the body regions positioned below the first regions.

According to this configuration, the breakdown voltage of the switching device is further hardly affected by the depth of the first trenches.

In a configuration example of the present disclosure, the semiconductor substrate may include an outer peripheral voltage resistant range disposed between the ineffective range and the outer peripheral end surface of the semiconductor substrate. A guard ring of the second conductivity type may be provided in the outer peripheral voltage resistant range. The guard ring may be exposed on the upper surface of the semiconductor substrate, may surround the first element range and the ineffective range, and may be electrically separated from the first metal layer.

According to this configuration, the breakdown voltage of can be further improved.

In a configuration example of the present disclosure, the semiconductor substrate may include a second element range disposed between the ineffective range and the outer peripheral voltage resistant range. The first trenches may extend across the first element range, the ineffective range, and the second element range. Within the second element range, a plurality of the second trenches may be provided in the upper surface in each of the inter-trench regions. Within the second element range, a contact hole may be provided in a portion of the interlayer insulation film that covers the upper surface of the semiconductor substrate. The first metal layer may be in contact with the upper surface in the contact hole within the second element range. The insulating protective film may cover the first metal layer in the second element range. The second metal layer may be disposed across from on the first metal layer in the opening and to on the insulating protective film. An outer peripheral side end portion of the second metal layer may be positioned on an inner peripheral side relative to an outer peripheral side end portion of the first metal layer. Each of the inter-trench regions in the second element range may include the first region and the body region.

For ensuring reliability of the switching device, an interval may be provided between the inner side end portion of the insulating protective film and the outer side end portion of the first metal layer, and an outer side end portion of the second metal layer may be disposed in the interval. By providing the second element range (range functioning as the switching device) in this interval portion, current capacity of the switching device can be increased.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A switching device comprising:
a semiconductor substrate including a first element range, and an inactive region disposed between the first element range and an outer peripheral end surface of the semiconductor substrate;
a plurality of first trenches provided in an upper surface of the semiconductor substrate, the plurality of first trenches extending in parallel to each other along a first direction across the first element range and the inactive region, in a plan view of the upper surface of the semiconductor substrate, each region interposed between the first trenches is set as an inter-trench region;
a plurality of second trenches provided in the upper surface in each of the inter-trench regions within the first element range and not provided within the inactive region, the second trenches spaced apart from each other along the first direction, each of the second trenches connected to two of the first trenches, a width of the inactive region in the first direction is greater than a pitch of the second trenches in the first direction,
each of the inter-trench regions within the inactive region including a second conductivity type peripheral region of the second conductivity type, the second conductivity type peripheral region connected to the body region, and
each of the inter-trench regions within the first element range including:
a first region of a first conductivity type in contact with the first metal layer and the gate insulating film, and
a body region of a second conductivity type in contact with the first metal layer and in contact with the gate insulating film below the first region,
a gate insulating film covering inner surfaces of the first trenches and inner surfaces of the second trenches;
a gate electrode disposed across inner portions of the first trenches and inner portions of the second trenches, the gate electrode insulated from the semiconductor substrate by the gate insulating film;
an interlayer insulating film covering the upper surface and the gate electrode range across the first element range and the inactive region, within the first element range, a contact hole is provided in a portion of the interlayer insulation film that covers the upper surface within the inactive region, and a contact hole is not provided in the portion of the interlayer insulation film that covers the upper surface;
a first metal layer covering the interlayer insulating film and insulated from the gate electrode by the interlayer insulating film, the first metal layer in contact with the semiconductor substrate within the contact hole, a recess is provided on a surface of the first metal layer above the contact hole;
an insulating protective film covering a portion of the first metal layer on an outer peripheral side in the inactive region, an opening is provided in the insulating protective film in a range wider than the first element range and a side surface of the opening disposed in the inactive region;

a second metal layer in contact with the surface of the first metal layer in the opening and additionally in contact with the side surface of the opening, the second metal layer having a linear expansion coefficient smaller than a linear expansion coefficient of the first metal layer; and a second region of the first conductivity type of the semiconductor substrate disposed across below the body region and below the second conductivity type peripheral region, the second region in contact with the gate insulating film below the body region and separated from the first regions by the body region.

2. The switching device of claim 1, wherein a lower end of the second conductivity type peripheral region is positioned below a lower end of each of the first trenches within the inactive region.

3. The switching device of claim 2, wherein a second conductivity-type impurity density of the second conductivity-type peripheral region is higher than a second conductivity-type impurity density of a portion of the body region positioned below the first region.

4. The switching device of claim 1, wherein the semiconductor substrate includes an outer peripheral voltage resistant range disposed between the inactive region and the outer peripheral end surface of the semiconductor substrate, and a guard ring of the second conductivity type is provided in the outer peripheral voltage resistant range, the guard ring exposed on the upper surface, surrounding the first element range and the inactive region, and electrically separated from the first metal layer.

5. The switching device of claim 4, wherein:

the semiconductor substrate further includes a second element range disposed between inactive region and the outer peripheral voltage resistant range;

the first trenches extend across the first element range, the inactive region, and the second element range;

within the second element range, a plurality of the second trenches is provided in the upper surface in each of the inter-trench regions and a contact hole is provided in a portion of the interlayer insulation film that covers the upper surface;

the first metal layer is in contact with the upper surface in the contact hole within the second element range;

the insulating protective film covers the first metal layer in the second element range;

the second metal layer is disposed across from on the first metal in the opening and to on the insulating protective film;

an outer peripheral side end portion of the second metal layer is positioned on an inner peripheral side relative to an outer peripheral side end portion of the first metal layer; and each of the inter-trench regions in the second element range includes the first region and the body region.

* * * * *